United States Patent
Chen

(10) Patent No.: US 10,003,172 B1
(45) Date of Patent: Jun. 19, 2018

(54) CIRCUIT LAYOUT OF LASER SOURCE DRIVING CIRCUIT

(71) Applicants: Sintai Optical (Shenzhen) Co., Ltd., ShenZhen, Guandong Province (CN); Asia Optical Co., Inc., Taichung (TW)

(72) Inventor: Tung-Ching Chen, Taichung (TW)

(73) Assignees: SINTAI OPTICAL (SHENZHEN) CO., LTD., Shenzhen, Guangdong Province (CN); ASIA OPTICAL CO., INC., Taichung (TW)

(*) Notice: Subject to any disclaimer, the term of this patent is extended or adjusted under 35 U.S.C. 154(b) by 0 days. days.

(21) Appl. No.: 15/841,715

(22) Filed: Dec. 14, 2017

(30) Foreign Application Priority Data

Mar. 15, 2017 (CN) .......................... 2017 1 0152030

(51) Int. Cl.
| | |
|---|---|
| H03K 17/16 | (2006.01) |
| H01S 5/042 | (2006.01) |
| G01S 7/484 | (2006.01) |
| H01S 5/068 | (2006.01) |

(52) U.S. Cl.
CPC .............. H01S 5/042 (2013.01); G01S 7/484 (2013.01); H01S 5/06817 (2013.01)

(58) Field of Classification Search
CPC ............. H03K 17/04113; H03K 17/16; H03K 17/161; H03K 17/162; H03K 17/567; H03K 17/62; H01L 25/0753; H01L 27/12; H01L 27/1211; H01L 27/1214; H01L 27/14609; H01L 2924/12042; H01L 2924/1205; H01L 2924/1207; G11B 7/126; G03B 21/2033
See application file for complete search history.

(56) References Cited

U.S. PATENT DOCUMENTS

| | | | | |
|---|---|---|---|---|
| 5,739,717 A | * | 4/1998 | Nakamura | ............. G11B 7/126 327/108 |
| 6,875,998 B2 | * | 4/2005 | Kato | ....................... H01L 27/12 257/59 |
| 7,858,994 B2 | * | 12/2010 | Daniels | ............. G02F 1/133603 257/100 |
| 7,947,612 B2 | * | 5/2011 | Cain | ..................... H01L 27/283 257/E21.347 |

* cited by examiner

Primary Examiner — Haissa Philogene
(74) Attorney, Agent, or Firm — McClure, Qualey & Rodack, LLP

(57) ABSTRACT

A circuit layout of laser source driving circuit includes a laser element, a first layout layer, a second layout layer, a first trace and a second trace. The first layout layer includes a first transistor. The second layout layer includes a second transistor, a capacitor, a first resistor and a second resistor. The first trace includes a first conductive line connecting the first resistor and the capacitor and a second conductive line connecting the capacitor and the laser element. The second trace includes a third conductive line connecting the second resistor and the second transistor, a fourth conductive line connecting the second transistor and the first transistor and a fifth conductive line connecting the first transistor and the laser element. A total length of the first trace and the second trace ranges from 13 mm to 19 mm.

19 Claims, 8 Drawing Sheets

CIRCUIT LAYOUT OF LASER SOURCE DRIVING CIRCUIT

BACKGROUND OF THE INVENTION

Field of the Invention

The invention relates to a circuit layout of a laser source driving circuit, and more particularly to a circuit layout of a laser source driving circuit with enhanced ability to measure distance.

Description of the Related Art

Referring to FIGS. 1 and 2A-2C, FIGS. 1 and 2A-2C depict a laser source driving circuit and a prior circuit layout thereof. The prior circuit layout of the laser source driving circuit includes a top layer 10, a middle layer 11, and a bottom layer 12. The top layer 10 includes a laser element LD, a first transistor Q102, a third resistor R101, a fourth resistor R103 and a top substrate 100. The middle layer 11 includes a middle substrate 101. The bottom layer 12 includes a third transistor Q100, a second transistor Q101, a capacitor C100, a first resistor R100, a second Resistor R102 and a bottom substrate 102. The top substrate 100, the middle substrate 101 and the bottom substrate 102 are configured to bear above elements and are provided with a plurality of conductive lines and a plurality of via holes. The conductive lines and the via holes are configured to connect above elements which constitute the laser source driving circuit.

As shown in FIG. 2C, a first trace includes a conductive line a11 and another conductive line a12. On the bottom substrate 102, a second pin R1002 of the first resistor R100 is connected to a first pin C1001 of the capacitor C100 through a conductive line a11, and the first pin C1001 is connected to a first pin LD1 of the laser element LD. As shown in FIGS. 2A and 2B, a second trace includes a conductive line b11 and another conductive line b12. A second pin Q1022 of the first transistor Q102 is connected to a via hole K on the top substrate 100. A second pin R1022 of the second resistor R102 and a second pin Q1012 of the second transistor Q101 are both connected to the via hole K through the conductive line b11 on the bottom substrate 102. The via hole K is connected to a second pin LD2 of the laser element LD through the conductive line b12 on the middle substrate 101. A length of the first trace is substantially 21.58036±5% mm, and a length of the second trace is substantially 21.58036±5% mm. In other words, the length of the first trace substantially ranges from 3.579809 mm to 3.6956631 mm, and the length of the second trace substantially ranges from 20.501342 mm to 22.659378 mm.

However, the laser source driving circuit may have the problem of signal noise (e.g. a crosstalk which commonly occurs in printed circuit boards) due to the first trace and the second trace. The crosstalk is disadvantageous to measurement of distance of a laser rangefinder (or laser sight). Therefore, circuit layout of the laser source driving circuit has a significant effect on a laser rangefinder (or laser sight capable of measuring distance).

BRIEF SUMMARY OF THE INVENTION

The invention provides a circuit layout of a laser source driving circuit, wherein the circuit layout of the laser source driving circuit and the locations of electrical elements are changed to eliminate crosstalk, thereby improving problems of the laser source driving circuit and enhancing the performance of laser rangefinders (or laser sights capable of measuring distance).

A circuit layout of laser source driving circuit in accordance with an embodiment of the invention includes a laser element, a first layout layer, a second layout layer, a first trace and a second trace. The first layout layer includes a first transistor. The second layout layer includes a second transistor, a capacitor, a first resistor and a second resistor. The first trace includes a first conductive line connecting a second pin of the first resistor and a first pin of the capacitor and a second conductive line connecting the first pin of the capacitor and a first pin of the laser element. The second trace includes a third conductive line connecting a second pin of the second resistor and a second pin of the second transistor, a fourth conductive line connecting the second pin of the second transistor and a second pin of the first transistor and a fifth conductive line connecting the second pin of the first transistor and a second pin of the laser element. A total length of the first trace and the second trace ranges from 13 mm to 19 mm.

In another embodiment, a length of the first trace substantially ranges from 7.8 mm to 8.7 mm, and a length of the second trace substantially ranges from 8.5 mm to 9.5 mm.

In yet another embodiment, a length of the first trace substantially ranges from 8.3 mm to 9.3 mm, and a length of the second trace substantially ranges from 4.9 mm to 5.6 mm.

In another embodiment, the circuit layout of laser source driving circuit further includes a first via hole, wherein the first via hole connects the second pin of the second transistor and the second pin of the first transistor after the second pin of the second resistor and the second pin of the second transistor are connected.

In yet another embodiment, the first transistor is an N-type Metal-Oxide-Semiconductor Field-Effect Transistor (MOSFET), and the second pin of the first transistor is a drain terminal; the second transistor is a PNP-type Bipolar Junction Transistor (BJT), and the second pin of the second transistor is an emitter terminal.

In another embodiment, the circuit layout of laser source driving circuit further includes at least two second via holes, wherein the second via holes connect a first pin of the first transistor and a third pin of the second transistor, and a first pin of the second transistor is connected to a first pin of the second resistor.

In yet another embodiment, the second layout layer further includes a third transistor, a third resistor and a fourth resistor, wherein a second pin of the third transistor, the first pin of the second transistor and the first pin of the second resistor are connected to each other; a second pin of the third resistor is connected to a first pin of the third transistor; a first pin of the fourth resistor is connected to the third pin of the second transistor.

In another embodiment, the circuit layout of laser source driving circuit further includes a pulse signal line connected to a first pin of the third resistor.

In yet another embodiment, the circuit layout of laser source driving circuit further includes a ground line connected to a second pin of the capacitor, a third pin of the first transistor, a second pin of the fourth resistor and a third pin of the third transistor.

In another embodiment, the circuit layout of laser source driving circuit further includes a power line connected to a first pin of the first resistor.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 2A:
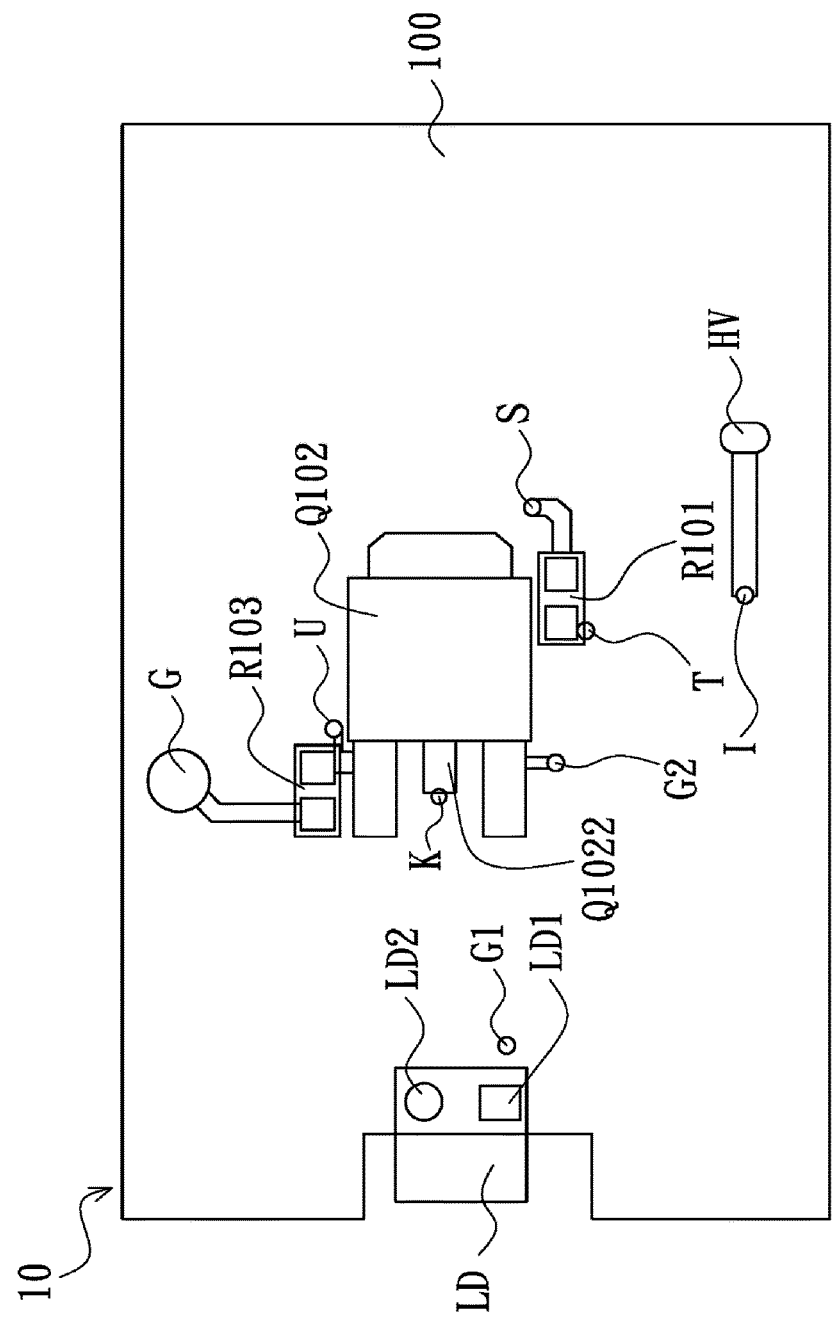
FIG. 2A is a schematic view of a top layer of a prior circuit layout of a laser source driving circuit.
Figure 2B:
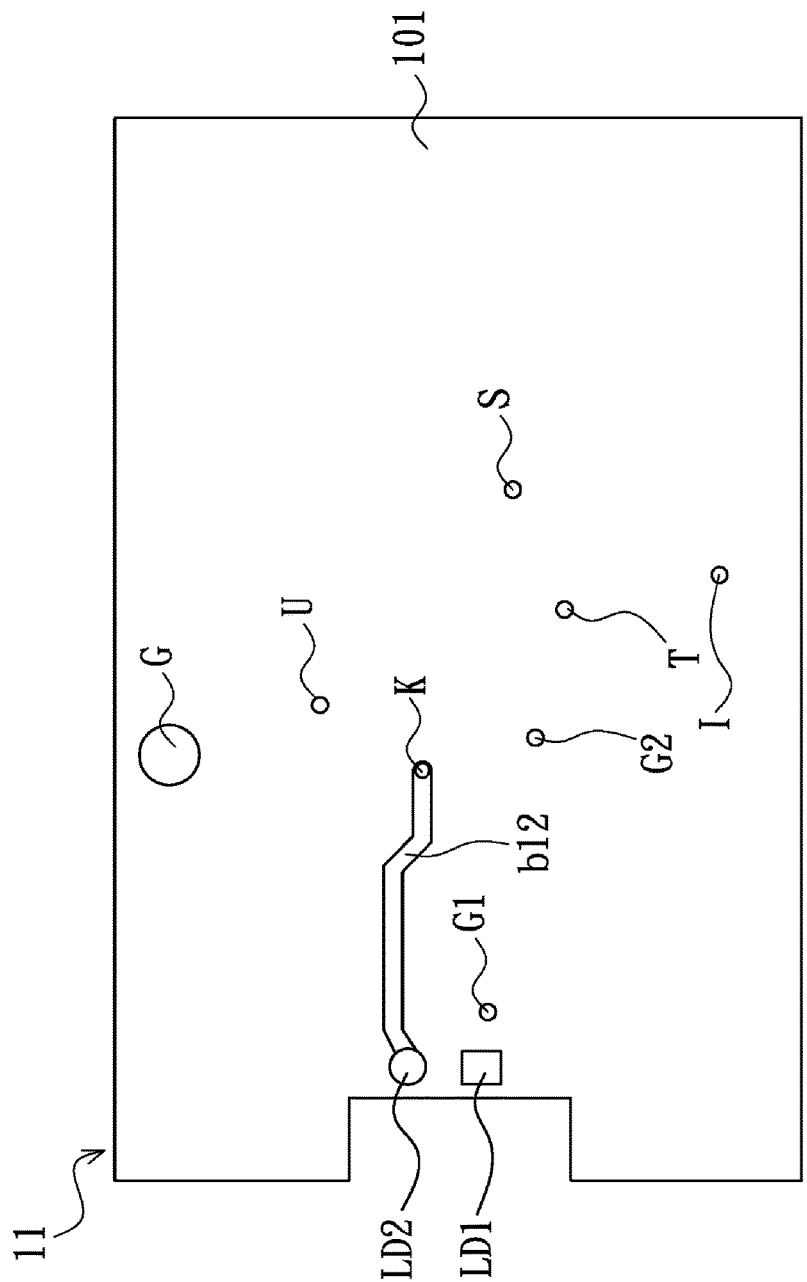
FIG. 2B is a schematic view of a middle layer of the prior circuit layout of the laser source driving circuit.
Figure 2C:
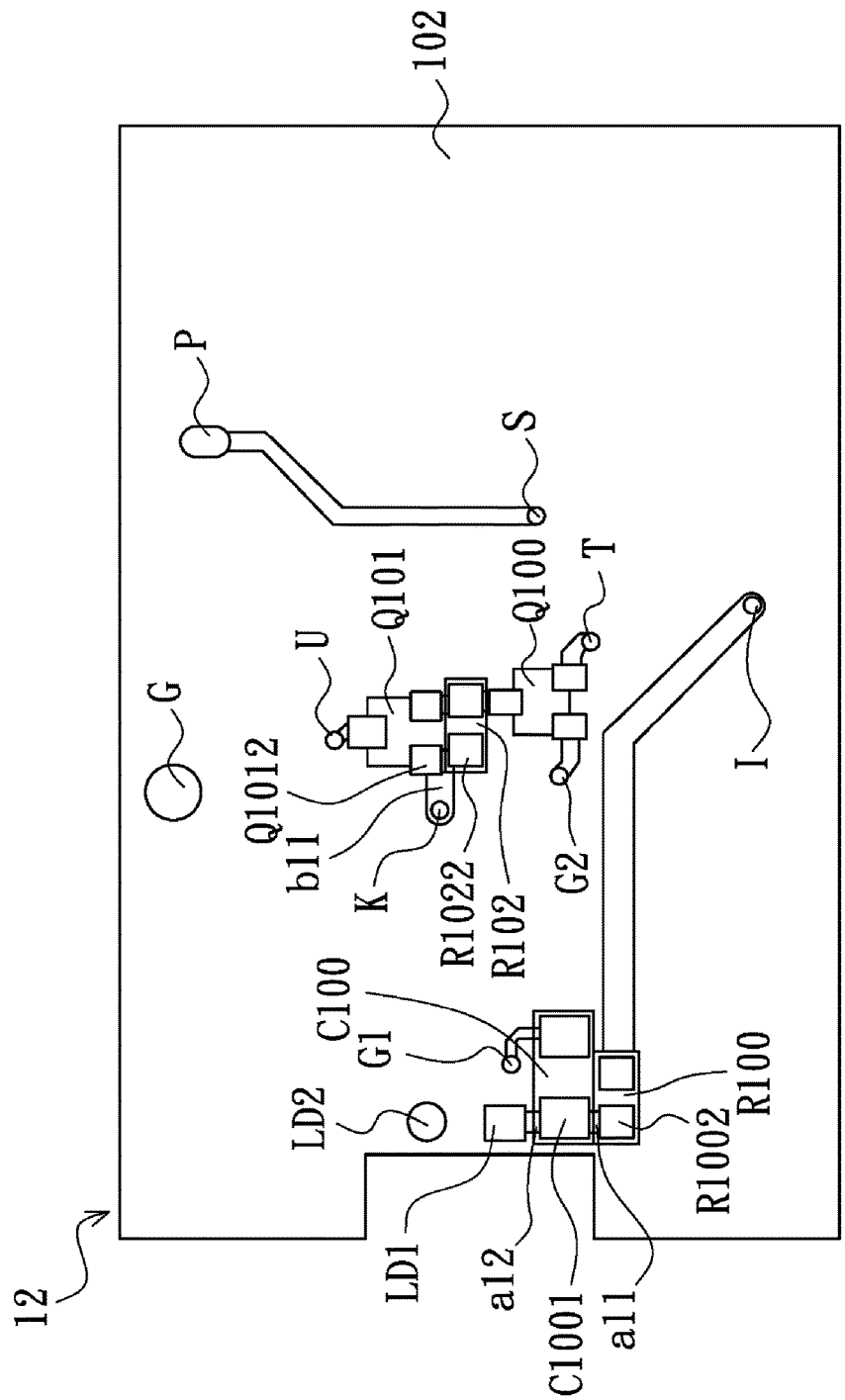
FIG. 2C is a schematic view of a bottom layer of the prior circuit layout of the laser source driving circuit.

In order to enhance performance of laser rangefinders (or laser sights capable of measuring distance), resolving the signal noise problems of a circuit layout of the laser source driving circuit is required. That is, eliminating the crosstalk generated by the first trace and the second trace routed on the prior circuit layout (as shown in FIGS. 2A-2C) is required. In the invention, therefore, the first trace and the second trace are shortened.

Figure 1:
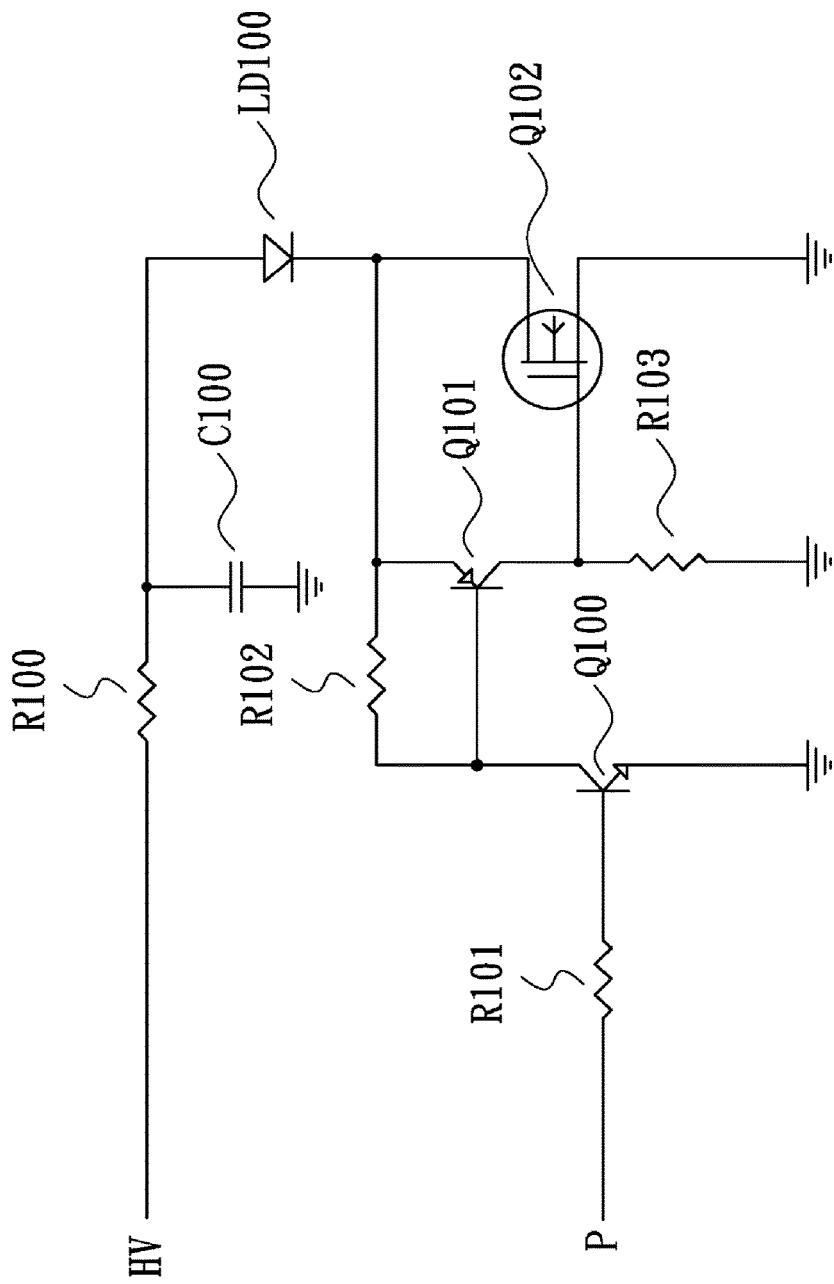
FIG. 1 is a schematic diagram of a laser source driving circuit.
Figure 3A:
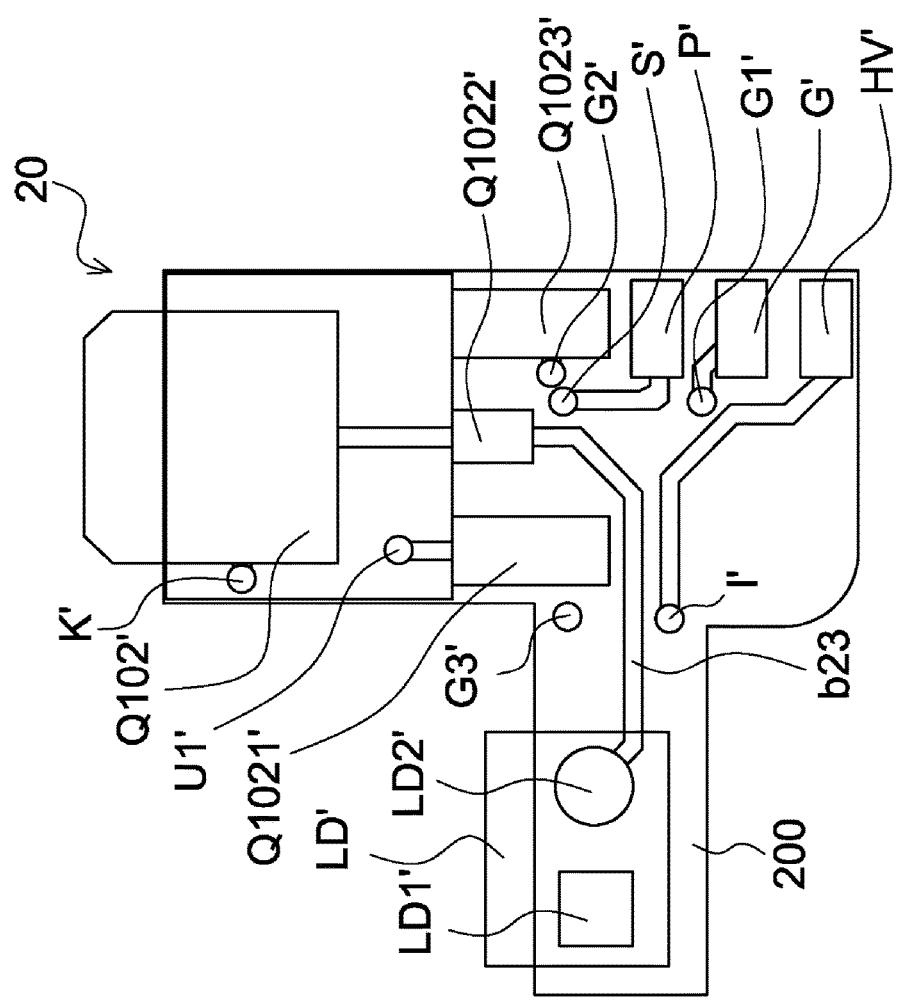
FIG. 3A is a schematic view of a top layer of a circuit layout of a laser source driving circuit in accordance with a first embodiment of the invention.
Figure 3B:
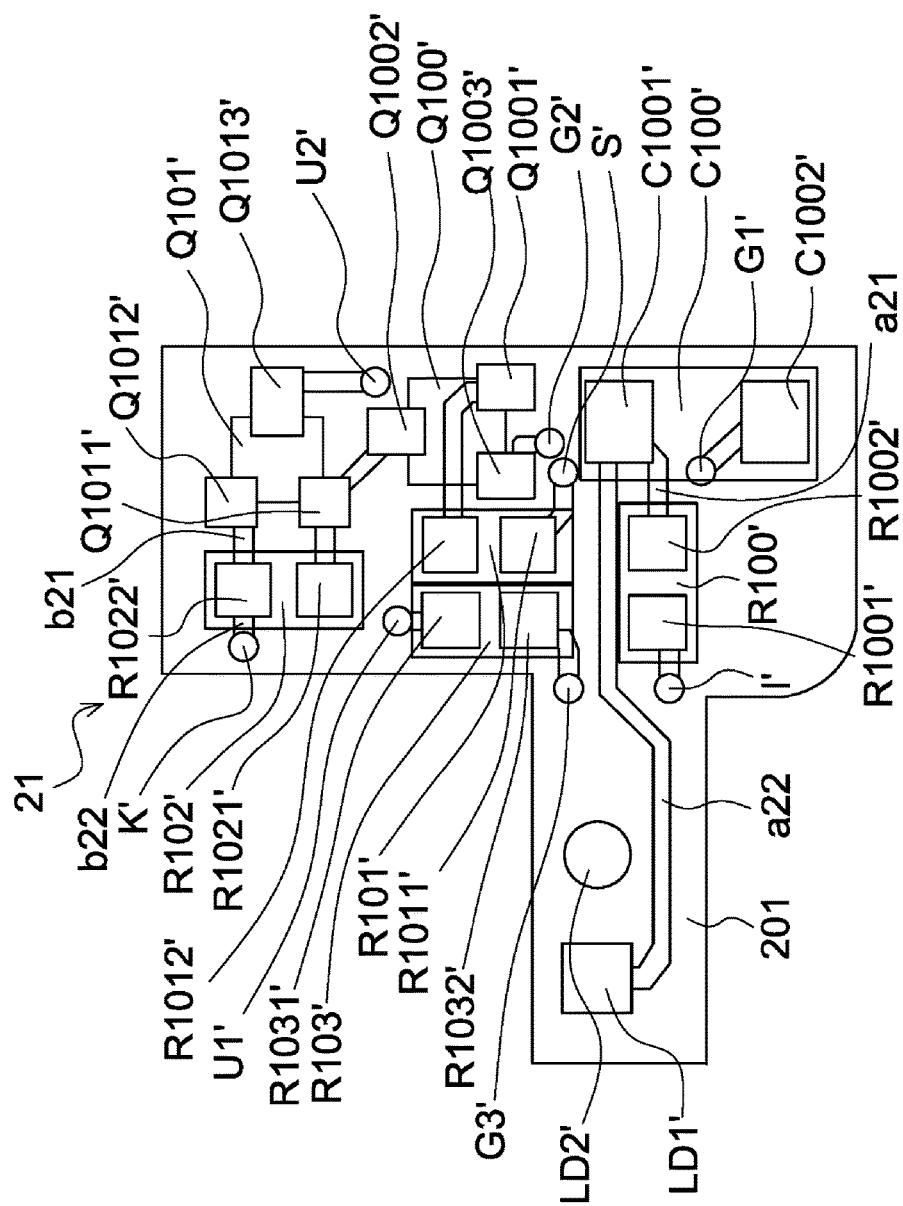
FIG. 3B is a schematic view of a bottom layer of a circuit layout of a laser source driving circuit in accordance with the first embodiment of the invention.

Referring to FIGS. 1, 3A and 3B, a circuit layout of a laser source driving circuit in accordance with a first embodiment of the invention includes a top layer 20 and a bottom layer 21. The top layer 20 includes a laser element LD', a first transistor Q102' and a top substrate 200. The bottom layer 21 includes a third transistor Q100', a second transistor Q101', a capacitor C100', a first resistor R100', a third resistor R101', a second resistor R102', a fourth resistor R103' and a bottom substrate 201. The top substrate 200 and the bottom substrate 201 are configured to bear above elements and are provided with a plurality of conductive lines and a plurality of via holes. The conductive lines and the via holes are configured to connect above elements which constitute the laser source driving circuit.

The top layer 20 is provided with a power line HV', a ground line G' and a pulse signal line P'. The power line HV' is configured to connect to a power source (not shown), the ground line G' is configured to connect to a ground (not shown) and the pulse signal line P' is configured to connect to a pulse signal input source (not shown). The power line HV' is disposed on a corner of the top substrate 200. The ground line G' and the pulse signal line P' are disposed beside the power line HV' along an edge of the top substrate 200. The power line HV' is connected to the bottom substrate 201 through a via hole I' and is connected to a first pin R1001' of the first resistor R100'. A second pin R1002' of the first resistor R100' is connected to a first pin C1001' of the capacitor C100' through a conductive line a21. The first pin C1001' is connected to a first pin LD1' of the laser element LD' through a conductive line a22. The conductive line a21 and the conductive line a22 function corresponding to the first trace of FIG. 2C. Besides, a second pin C1002' of the capacitor C100' is connected to the ground line G' through a via hole G1'.

As shown in FIGS. 3A and 3B, the pulse signal line P' is connected to the bottom substrate 201 through a via hole S' and is connected to a first pin R1011' of the third resistor R101'. A second pin R1012' of the third resistor R101' is connected to a first pin Q1001' of the third transistor Q100'. A second pin Q1002' of the third transistor Q100', a first pin Q1011' of the second transistor Q101' and a first pin R1021' of the second resistor R102' are connected through two conductive lines. A third pin Q1003' of the third transistor Q100' is connected to the ground line G' through a via hole G2'. A third pin Q1013' of the second transistor Q101' is connected to a via hole U2'. The via hole U2' is connected to a via hole U1' through a conductive line (not shown) disposed on a rear face of the bottom substrate 201 wherein the via hole U1' conducts the top layer 20 and the bottom layer 21. The third pin Q1013' of the second transistor Q101' is connected to a first pin Q1021' of the first transistor Q102' disposed on the top substrate 200 and a first pin R1031' of the fourth resistor R103' disposed on the bottom substrate 201 through the via holes U1', U2'. A second pin R1032' of the fourth resistor R103' and a third pin Q1023' of the first transistor Q102' are connected to the ground line G' respectively through a via hole G3' and a via hole G2'. It is noted that a second pin Q1012' of the second transistor Q101' is connected to a second pin R1022' of the second resistor R102' through a conductive line b21. The second pin R1022' of the second resistor R102' is connected to a via hole K' through a conductive line b22 and is further connected to the top substrate 200 through the via hole K'. The via hole K' is connected to a second pin Q1022' of the first transistor Q102' on the top substrate 200, and the second pin Q1022' of the first transistor Q102' is connected to a second pin LD2' of the laser element LD' through a conductive line b23. The conductive line b21, the conductive line b22 and the conductive line b23 function corresponding to the second trace of FIGS. 2B and 2C. In the first embodiment, a length of a first trace is substantially 8.24623±5% mm, and a length of a second trace is substantially 8.97656±5% mm. In other words, the length of the first trace substantially ranges from 7.8339185 mm to 8.6585415 mm, and the length of the second trace substantially ranges from 8.527732 mm to 9.425388 mm.

Figure 4A:
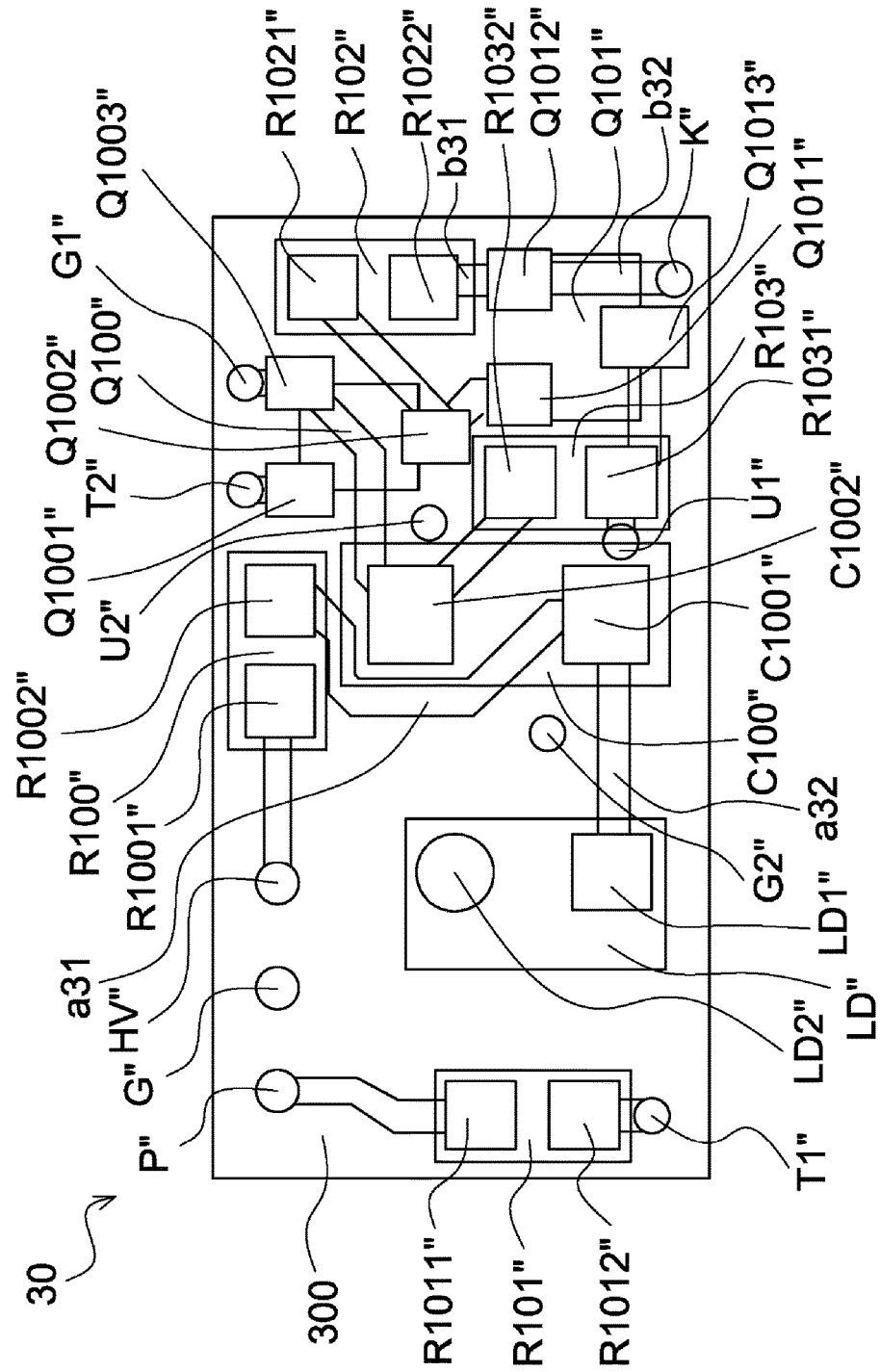
FIG. 4A is a schematic view of a top layer of a circuit layout of a laser source driving circuit in accordance with a second embodiment of the invention.
Figure 4B:
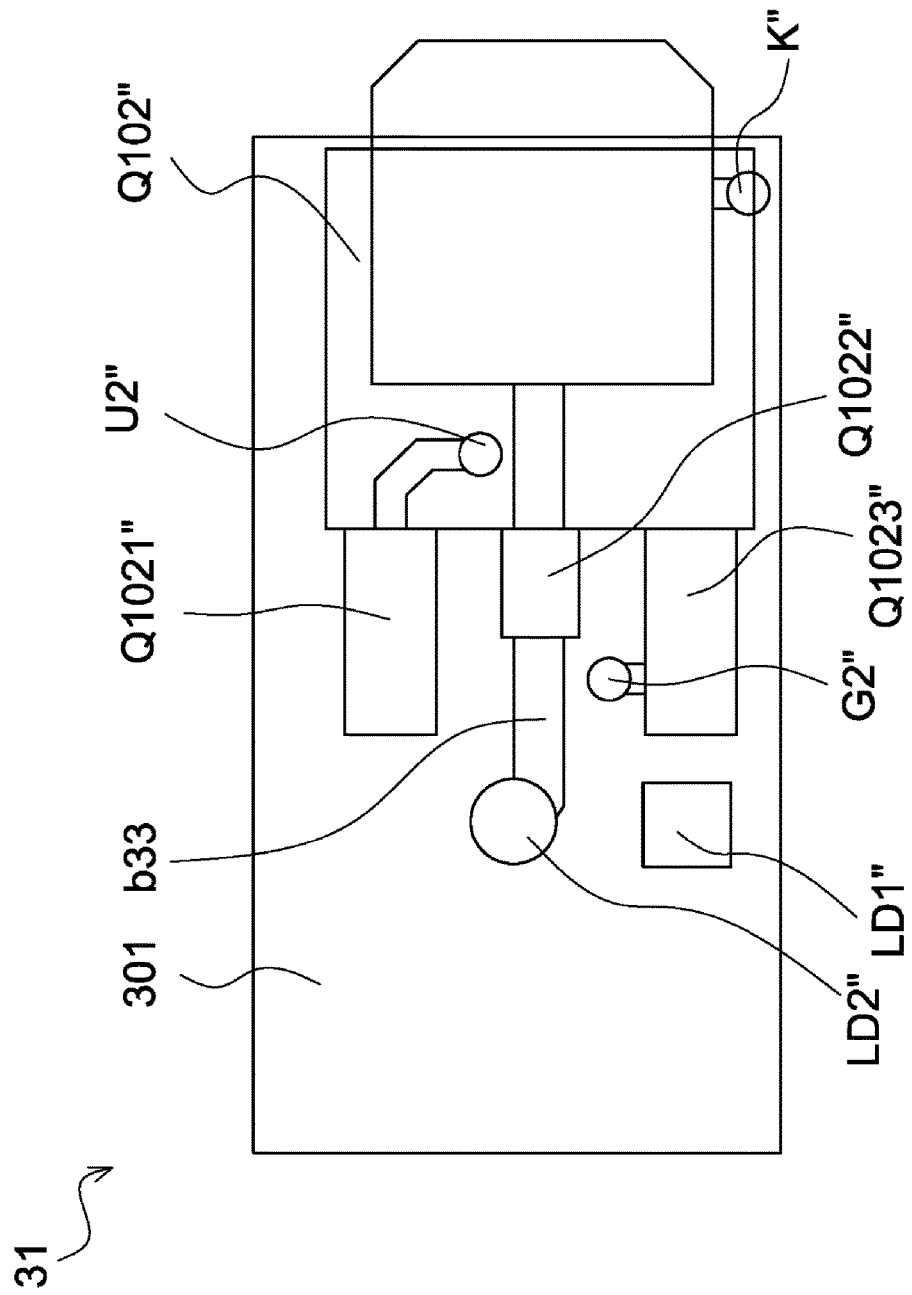
FIG. 4B is a schematic view of a bottom layer of a circuit layout of a laser source driving circuit in accordance with the second embodiment of the invention.

Referring to FIGS. 1, 4A and 4B, a circuit layout of laser source driving circuit in accordance with a second embodiment of the invention includes a top layer 30 and a bottom layer 31. The top layer 30 includes a laser element LD", a third transistor Q100", a second transistor Q101", a capacitor C100", a first resistor R100", a third resistor R101", a second resistor R102", a fourth resistor R103" and a top substrate 300. The bottom layer 31 includes a first transistor Q102" and a bottom substrate 301. The top substrate 300 and the bottom substrate 301 are configured to bear above elements and are provided with a plurality of conductive lines and a plurality of via holes. The conductive lines and the via holes are configured to connect above elements which constitute the laser source driving circuit.

As shown in FIGS. 4A and 4B, the top layer 30 is provided with a power line HV", a ground line G" and a pulse signal line P". The power line HV" is configured to connect to a power source (not shown), the ground line G" is configured to connect to a ground (not shown) and the pulse signal line P" is configured to connect to a pulse signal input source (not shown). The power line HV" is disposed on a corner of the top substrate 300. The ground line G" and the pulse signal line P" are disposed beside the power line HV" along an edge of the top substrate 300. The power line HV" is directly connected to a first pin R1001" of the first resistor R100". A second pin R1002" of the first resistor R100" is connected to a first pin C1001" of the capacitor C100" by routing a conductive line a31 to bypass a second pin C1002" of the capacitor C100". The first pin C1001" of the capacitor C100" is connected to a first pin LD1" of the laser element LD" through a conductive line a32. The conductive line a31 and the conductive line a32 function corresponding to the first trace of FIG. 2C. In addition, the pulse signal line P" is directly connected to a first pin R1011" of the third resistor R101". A second pin R1012" of the third resistor R101" is connected to a via hole T1". The via hole T1" is connected to a via hole T2" through a conductive line (not shown) disposed on a rear face of the top substrate 300. The via hole T2" is connected to a first pin Q1001" of the third transistor Q100". In other words, the second pin R1012" of the third resistor R101" is connected to the first pin Q1001" of the third transistor Q100" through the via holes T1", T2". A second pin Q1002" of the third transistor Q100", a first pin Q1011" of the second transistor Q101" and a first pin R1021" of the second resistor R102" are connected through two conductive lines. A third pin Q1013" of the second transistor Q101" is connected to a first pin R1031" of the fourth resistor R103". A second pin R1032" of the fourth resistor R103", a second pin C1002" of the capacitor C100" and a third pin Q1003" of the third transistor Q100" are connected to a via hole G1" for connecting to the ground line G". The first pin R1031" of the fourth resistor R103" is connected to a first pin Q1021" of the first transistor Q102" disposed on the bottom substrate 301 through two via holes U1", U2" which are similar to the via holes U1', U2' of the first embodiment. A third pin Q1023" of the first transistor Q102" is connected to the ground line G" through a via hole G2". It is noted that a second pin R1022" of the second resistor R102" is connected to a second pin Q1012" of the second transistor Q101" through a conductive line b31. The second pin Q1012" of the second transistor Q101" is connected to a via hole K" through a conductive line b32 and is further connected to the bottom substrate 301 through the via hole K". The via hole K" is connected to a second pin Q1022" of the first transistor Q102" on the bottom substrate 301, and the second pin Q1022" of the first transistor Q102" is connected to a second pin LD2" of the laser element LD" through a conductive line b33. The conductive line b31, the conductive line b32 and the conductive line b33 function corresponding to the prior second trace of FIGS. 2B and 2C. In the second embodiment, a length of a first trace is substantially 8.78709±5% mm, and a length of a second trace is substantially 5.2489±5% mm. In other words, the length of the first trace substantially ranges from 8.3477355 mm to 9.2264445 mm, and the length of the second trace substantially ranges from 4.986455 mm to 5.511345 mm.

It is worth noting that both a total length of the first trace and the second trace in the first embodiment is 17.22279±5% mm, and a total length of the first trace and the second trace in the second embodiment is 14.03599±5% mm, either of which is shorter than a total length (25.34858±5% mm) of the first trace and the second trace of the prior circuit layout. Specifically, the total length of the first trace and the second trace substantially ranges from 24.081151 mm to 26.616009 mm, the total length of the first trace and the second trace in the first embodiment substantially ranges from 16.3616505 mm to 18.0839295 mm, and the total length of the first trace and the second trace in the second embodiment substantially ranges from 13.3341905 mm to 14.7377895 mm.

Referring to Table 1, according to a formula: Energy (nJ)=$V_{Peak}$ (V)×Pulse Width (Sec)×Power Meter Factor (Watt/V), the laser pulse width and the peak voltage are variable when the laser energy and the power meter factor are fixed. As described above, the crosstalk can be effectively eliminated after the first trace and the second trace are both shortened, and therefore the performance of a laser rangefinder (or laser sight capable of measuring distance) can be enhanced. As shown in Table 1, the total length of the first trace and the second trace of the invention ranges from 14±5% mm to 18±5% mm. That is, the total length of the first trace and the second trace of the invention ranges from 13.3 mm to 18.9 mm.

TABLE 1

| Figure | Prior circuit layout FIGS. 2A-2C | First embodiment FIGS. 3A-3B | Second embodiment FIGS. 4A-4B |
|---|---|---|---|
| Total length of the first trace and the second trace (mm) | 25.34858 ± 5% | 17.22279 ± 5% | 14.03599 ± 5% |
| Peak voltage (mV) | 209 | 229 | 241 |
| Pulse width (Sec) | 27.3 | 25.02 | 23.65 |
| Power meter factor (Watt/V) | 98 | 98 | 98 |
| Energy (nJ) | 559.1586 | 561.49884 | 558.5657 |

In the above embodiments, the power source ranges from 0 to 110 volt. The third transistor Q100' (or Q100") is a NPN-type Bipolar Junction Transistor (BJT), and the first pin Q1001' (or Q1001"), the second pin Q1002' (or Q1002") and the third pin Q1003' (or Q1003") thereof are respectively a base terminal, a collector terminal and an emitter terminal. The second transistor Q101' (or Q101") is a PNP-type Bipolar Junction Transistor (BJT), and the first pin Q1011' (or Q1011"), the second pin Q1012' (or Q1012") and the third pin Q1013' (or Q1013") thereof are respectively a base terminal, an emitter terminal and a collector terminal. The first transistor Q102' (or Q102") is an N-type Metal-Oxide-Semiconductor Field-Effect Transistor (MOSFET), and the first pin Q1021' (or Q1021"), the second pin Q1022' (or Q1022") and the third pin Q1023' (or Q1023") thereof are respectively a gate terminal, a drain terminal and a source terminal. The first resistor R100' (or R100") is a 100k Ohm resistor, the second resistor R102' (or R102") is a 3.9k Ohm resistor, the third resistor R101' (or R101") is a 510 Ohm resistor and the fourth resistor R103' (or R103") is a 7.5k Ohm resistor. The capacitor C100' (or C100") is a 0.0047 micro-Farad capacitor.

Although not shown, the via holes G1', G2' and G3' (or the via holes G1" and G2") described above are routed for connecting to the ground line G' (or the ground line G"). In the invention, the connection between two electrical elements, between an electrical element and a via hole, or between two via holes may be achieved through conductive lines. Also, via holes disposed on different substrates may be connected through conductive lines or conductors.

What is claimed is:
1. A circuit layout of laser source driving circuit, comprising:
 a laser element;
 a first layout layer comprising a first transistor;
 a second layout layer comprising a second transistor, a capacitor, a first resistor and a second resistor;

a first trace comprising a first conductive line and a second conductive line, wherein the first conductive line connects a second pin of the first resistor and a first pin of the capacitor, and the second conductive line connects the first pin of the capacitor and a first pin of the laser element; and a second trace comprising a third conductive line, a fourth conductive line and a fifth conductive line wherein the third conductive line connects a second pin of the second resistor and a second pin of the second transistor, the fourth conductive line connects the second pin of the second transistor and a second pin of the first transistor, and the fifth conductive line connects the second pin of the first transistor and a second pin of the laser element;

wherein a total length of the first trace and the second trace ranges from 13 mm to 19 mm.

2. The circuit layout of laser source driving circuit as claimed in claim 1, wherein a length of the first trace substantially ranges from 7.8 mm to 8.7 mm.

3. The circuit layout of laser source driving circuit as claimed in claim 1, wherein a length of the second trace substantially ranges from 8.5 mm to 9.5 mm.

4. The circuit layout of laser source driving circuit as claimed in claim 3, wherein a length of the first trace substantially ranges from 7.8 mm to 8.7 mm.

5. The circuit layout of laser source driving circuit as claimed in claim 1, wherein a length of the first trace substantially ranges from 8.3 mm to 9.3 mm.

6. The circuit layout of laser source driving circuit as claimed in claim 1, wherein a length of the second trace substantially ranges from 4.9 mm to 5.6 mm.

7. The circuit layout of laser source driving circuit as claimed in claim 6, wherein a length of the first trace substantially ranges from 8.3 mm to 9.3 mm.

8. The circuit layout of laser source driving circuit as claimed in claim 1, further comprising a first via hole, wherein the first via hole connects the second pin of the second transistor and the second pin of the first transistor after the second pin of the second resistor and the second pin of the second transistor are connected.

9. The circuit layout of laser source driving circuit as claimed in claim 1, wherein the first transistor is an N-type Metal-Oxide-Semiconductor Field-Effect Transistor (MOSFET), and the second pin of the first transistor is a drain terminal.

10. The circuit layout of laser source driving circuit as claimed in claim 1, wherein the second transistor is a PNP-type Bipolar Junction Transistor (BJT), and the second pin of the second transistor is an emitter terminal.

11. The circuit layout of laser source driving circuit as claimed in claim 10, wherein the first transistor is an N-type Metal-Oxide-Semiconductor Field-Effect Transistor (MOSFET), and the second pin of the first transistor is a drain terminal.

12. The circuit layout of laser source driving circuit as claimed in claim 1, further comprising at least two second via holes, wherein the second second transistor, and a first pin of the second transistor is connected to a first pin of the second resistor.

13. The circuit layout of laser source driving circuit as claimed in claim 12, wherein the second layout layer further comprises a third transistor, a third resistor and a fourth resistor; a second pin of the third transistor, the first pin of the second transistor and the first pin of the second resistor are connected to each other; a second pin of the third resistor is connected to a first pin of the third transistor; and a first pin of the fourth resistor is connected to the third pin of the second transistor.

14. The circuit layout of laser source driving circuit as claimed in claim 13, further comprising a ground line connected to a second pin of the capacitor.

15. The circuit layout of laser source driving circuit as claimed in claim 13, further comprising a ground line connected to a third pin of the first transistor.

16. The circuit layout of laser source driving circuit as claimed in claim 13, further comprising a ground line connected to a second pin of the fourth resistor.

17. The circuit layout of laser source driving circuit as claimed in claim 13, further comprising a ground line connected to a third pin of the third transistor.

18. The circuit layout of laser source driving circuit as claimed in claim 12, further comprising a pulse signal line connected to a first pin of the third resistor.

19. The circuit layout of laser source driving circuit as claimed in claim 1, further comprising a power line connected to a first pin of the first resistor.

* * * * *